United States Patent [19]

Bauer et al.

[11] Patent Number: 5,668,385
[45] Date of Patent: Sep. 16, 1997

[54] POWER SEMICONDUCTOR COMPONENT WITH TRANSPARENT EMITTER AND STOP LAYER

[75] Inventors: Friedhelm Bauer, Ittigen; Klas Lilja, Fislisbach, both of Switzerland

[73] Assignee: Asea Brown Boveri AG, Baden, Switzerland

[21] Appl. No.: 453,674

[22] Filed: May 30, 1995

Related U.S. Application Data

[63] Continuation of Ser. No. 225,446, Apr. 7, 1994, abandoned.

[30] Foreign Application Priority Data

Apr. 22, 1993 [DE] Germany ............ 43 13 170.0

[51] Int. Cl.⁶ ............ H01L 29/74; H01L 31/111; H01L 29/76
[52] U.S. Cl. ............ 257/139; 257/104; 257/147; 257/341
[58] Field of Search ............ 257/132, 133, 257/139, 140, 146, 147, 155, 163, 168, 171, 175, 104, 106, 603, 337, 339, 341, 342, 757

[56] References Cited

U.S. PATENT DOCUMENTS

| | | | |
|---|---|---|---|
| 4,517,582 | 5/1985 | Sittig | 257/168 |
| 4,617,583 | 10/1986 | Shinohe et al. | 257/163 |
| 4,893,165 | 1/1990 | Miller et al. | 257/757 |
| 4,910,573 | 3/1990 | Roggwiller | 257/147 |
| 5,001,535 | 3/1991 | Nishizawa et al. | 257/146 |
| 5,093,705 | 3/1992 | Voss | 257/155 |
| 5,306,929 | 4/1994 | Iwamuro | 257/139 |
| 5,324,971 | 6/1994 | Notley | 257/339 |

FOREIGN PATENT DOCUMENTS

| | | | |
|---|---|---|---|
| 0 329 992 | 8/1989 | European Pat. Off. | 257/168 |
| 0 405 138 | 1/1991 | European Pat. Off. | 257/133 |
| 0 528 349 | 2/1993 | European Pat. Off. | 257/133 |

OTHER PUBLICATIONS

IEEE Transactions on Power Electronics, vol. 5, No. 4, Oct. 1990, pp. 430–435, "8000–V 1000–A Gate Turn–Off Thyristor with Low On–State Voltage and Low Switching Loss", Mitsuru Kekura et al.

IEEE Transactions on Electron Devices, vol. ED–33, No. 10, Oct. 1986, pp. 1609–1618, "MOS–Controlled Thyristors—A New Class of Power Devices", Victor A. K. Temple.

IEEE Transactions on Power Electronics, vol. PE–2, No. 3, Jul. 1987, "A Performance Trade–Off for the Insulated Gate Bipolar Transistor: Buffer Layer Versus Base Lifetime Reduction", pp. 194–207, Hefner, Jr. et al.

Solid–State Electronics, vol. 35, No. 5, pp. 681–685, 1992 "A 2000 V Non–Punchthrough IGBT with High Ruggedness", T. Laska et al.

*Primary Examiner*—Steven H. Loke
*Attorney, Agent, or Firm*—Oblon, Spivak, McClelland, Maier & Neustadt, P.C.

[57] ABSTRACT

A power semiconductor component is specified which provides for a significant reduction in the thickness of the semiconductor substrate (1) whilst at the same time optimizing the switching losses. A transparent emitter (6) and a stop layer (7) are arranged to provide a thin semiconductor and optimized switching losses. The means can be used both in semiconductor switches such as IGBT, MCT or GTO and in diodes.

23 Claims, 3 Drawing Sheets

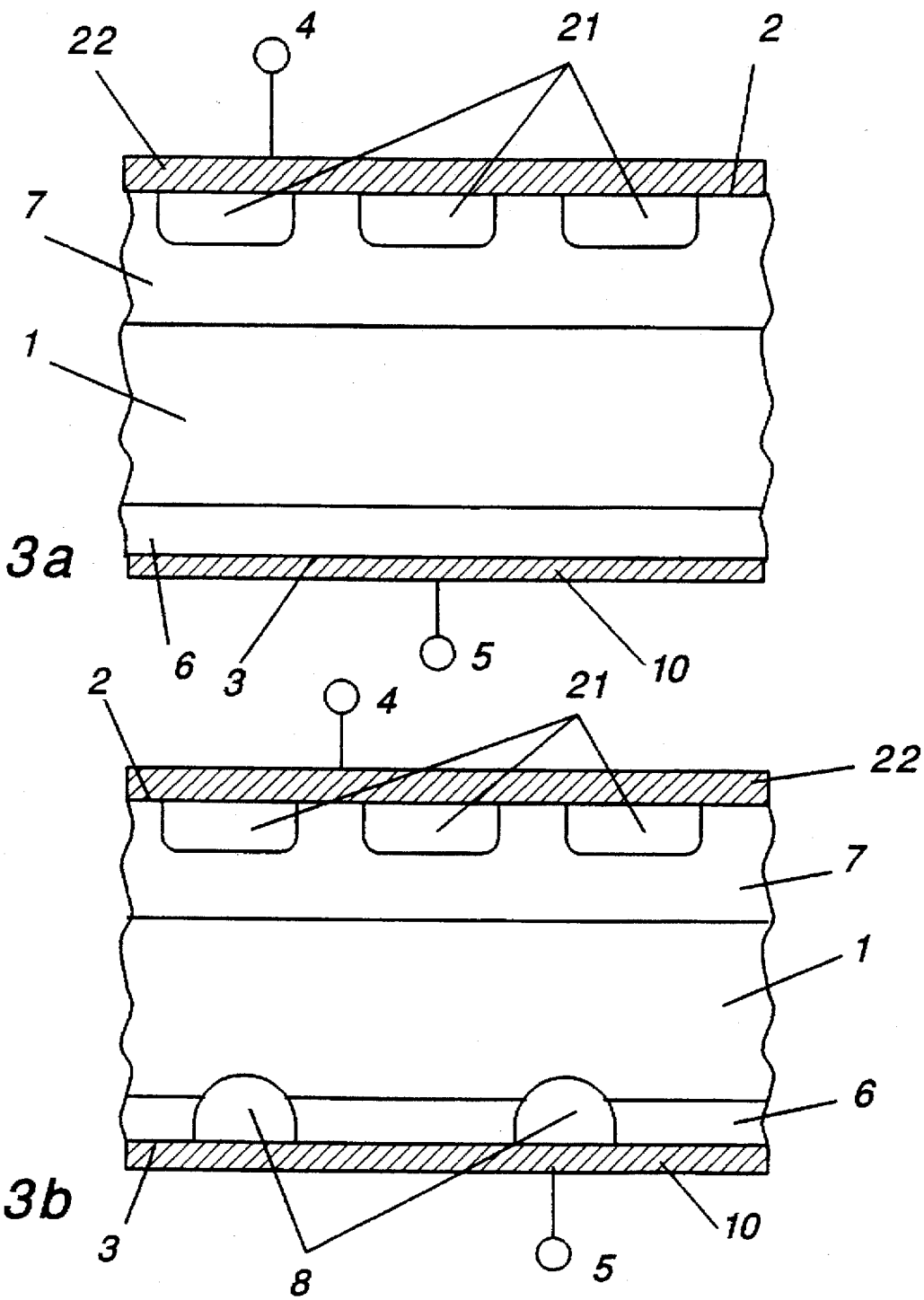

POWER SEMICONDUCTOR COMPONENT WITH TRANSPARENT EMITTER AND STOP LAYER

This application is a continuation of application Ser. No. 08/225,446, filed on Apr. 7, 1994, now abandoned.

BACKGROUND OF THE INVENTION

1. Field of the Invention

The invention relates to the field of power electronics.

It is based on a power semiconductor component for high blocking voltages.

2. Discussion of Background

Such a power semiconductor component is described as MCT, for example in the article "Evolution of MOS Bipolar Power Semiconductor Technology" (B. J. Baliga in Proceedings of the IEEE, Vol. 76, No. 4, April 1988), as IGBT, for example in EP-A2-0,405,138, and as GTO, for example in U.S. Pat. No. 4,910,573.

The problems on which the application is based will be explained in greater detail in the text which follows, referring to an IGBT as it is described in the abovementioned European patent specification.

The IGBT described in this document exhibits a PT (punch-through) IGBT structure. It comprises a highly doped stop layer having a short carrier life. The n-type base consists of an epitaxially grown layer, the thickness of which is selected in accordance with the desired blocking voltage. This IGBT structure prevails today in the range of blocking voltages of up to 1 kV.

The abovementioned conventional IGBT structure is not suitable for high-voltage applications (e.g. 4.5 kV blocking voltage) for a number of reasons:

- to the present day, there is no epitaxy technology available for guaranteeing the requirements for defect density and homogeneity of doping for very high blocking voltages;
- low turn-off losses can only be achieved with very short charge carrier lives; however, this entails an increase in the on-state losses which is unacceptable for high-voltage applications.

As a consequence, NPT (non-punch-through) IGBT structures are preferred today over the PT IGBTs for the range of higher blocking voltages (up to approximately 2 kV). Such an NPT IGBT structure is described in EP-A1-0,330,122. In each NPT power semiconductor component, the thickness of the semiconductor substrate is always greatly oversized for the required blocking voltage. This ensures that the field reins at a safe distance from the p+-type anode emitter even in the blocking case and thus no fatal short circuit can occur. A further reason for the great oversizing is based on keeping the magnitude of the tail currents and thus the magnitude of the turn-off losses at a low level. It is known that the tail currents will rise greatly if it is attempted to reduce the degree of oversizing of the substrate thickness. The increase in tail currents is attributed to a redistribution of the plasma in the quasi-neutral zone (from the anode end of the space charge zone up to the p+-type anode emitter).

The decay of the tail currents is essentially determined by the carrier life. Since the decay time constant is normally too long for achieving sufficiently low turn-off losses, means which support the decay time constant by charge carrier extraction are provided on the anode side. This can be done with the aid of a transparent emitter. In the case of GTOs it is also prior art to provide anode short circuits next to the p+-type anode emitter. The significant disadvantage of NPT power semiconductor structures for high-voltage applications consists in the uneconomic utilization of the substrate thickness. A typical NPT GTO for 4.5 kV exhibits a thickness of 700 μm of the n-type base zone. A PT version for the same blocking voltage, in contrast, would only need about 400 μm. The much lower on-state losses of a PT component can be used for achieving greatly reduced turn-off losses due to shortened carrier lives. As a consequence, a significant increase in the permissible switching frequency becomes possible.

The minimization of the substrate thickness is also of quite a significant importance for power diodes. In this manner, a PT structure can be used for reducing the recovered charge and thus the peak reverse recovery current to a minimum. However, it is known of such diode structures that an unwanted sharp discontinuity of the diode current occurs at the end of the depletion phase.

The practical embodiment of a PT power semiconductor component has previously also failed because of the connection of stop layer and anode and shorts. Because of the comparatively high conductivity of the stop layer, the greatest proportion of the electrons coming from the cathode flows into the anode short circuits. The p+-type anode emitters are then shorted too greatly and the basic advantage of the PT structure cannot be utilized because of the high on-state voltage. It has been attempted to prevent this by means of an extremely small proportion of anode shorts. However, the charge carrier extraction via the shorts is greatly impeded. As explained above, the level of the tail currents then increases with the consequence of unacceptably high turn-off losses.

The effects explained here occur both in the IGBT just discussed and in the MCT and GTO. In the diode, the chopping characteristic of the current during turn-off comes to the fore.

SUMMARY OF THE INVENTION

Accordingly, one object of the invention is to provide a novel power semiconductor component, particularly for high blocking voltages, in which the advantages of a PT structure with a minimally thin substrate as compared with an NPT component can be exploited without the abovementioned disadvantages and compromises.

In particular, an anode structure is to be defined which enables an optimally sized stop layer to be used for limiting the electrical field at the anode side, in combination with means for the maximum extraction of charge carriers at the anode side during the turn-off process. The anode structure is to be designed in such a manner that no current chopping occurs.

This object is achieved in a power semiconductor component of the type initially mentioned by means of the features of the first claim.

It is thus the core of the invention to provide means which make it possible to reduce the thickness of the power semiconductor component and, at the same time, to keep the losses to a minimum. A reduction of the semiconductor substrate thickness is only possible by limiting the field at the anode side with the aid of a stop layer. The extent into the substrate and the dopant gradient of this stop layer determines the chopping characteristic of the current. With a suitable design, the field can still partially penetrate into the frontmost part of the stop layer.

The tail currents are avoided in the semiconductor component according to the invention by combining the stop layer with a transparent emitter. A wide spectrum of turn-off current variations with time (from the abrupt current chopping with minimum turn-off losses to the soft decay of the current with only slightly higher turn-off losses) can be set by varying the extent of the stop layer, its maximum doping concentration and its doping gradient, on the one hand, and by adjusting dopant concentration and depth of the transparent emitter, on the other hand. This combination provides for excellent characteristics of the PT structure in comparison with a conventional NPT component: the variation of the turn-off losses of the PT component versus the anode voltage is linear whilst an NPT component is characterized by an approximately quadratic relation.

In the text which follows, a transparent emitter is understood to be an anode-side emitter layer which is structured in such a manner that a significant proportion of the total current leaves the anode metallization of the component as electron current. This electron current specified in % of the total current is called emitter transparency. Technologically, the emitter transparency can be adjusted within wide limits by means of depth and edge concentration of the p+-type anode emitter. p+-type anode emitters having a transparency of 50% and more are of technical significance. Combining a transparent emitter with a stop layer has the effect that the space charge zone penetrates into the stop layer during the turn-off process and pushes the charge through the transparent emitter out of the component. As a consequence of this, the current drops to zero within a very short time without the slowly decaying tail currents which are typical in conventional structures. This minimizes the turn-off losses.

The stop layer is needed for the following reason: in the stop layer, the penetration of the space charge zone stagnates during the building-up of the anode voltage. A small zone which is almost field-free remains within the stop layer. In this volume, there is thus only a small residue of the stored charge. Since there is only a very small field to transport this charge to the transparent emitter, the charge largely disappears due to the slow recombination. If then the thickness of the stop layer, and thus the remaining charge residue, is increased, the current will decay increasingly more softly.

The effects just described can be utilized both for IGBTs, MCTs, GTOs and diodes. Illustrative embodiments will therefore be specified for each of these components.

In the diode, the stop layer is not arranged on the anode side but on the cathode side because in the diode, the current changes direction when changing from conducting to blocking ("reverse recovery"), as is known. As has been stated above, the cathode-side stop layer in the diode prevents an abrupt chopping of the current at the end of the reverse recovery phase. The transparent p+-type anode emitter can also be advantageously combined with the cathode-side stop layer in the diode. Using both means allows the diode thickness to be minimized whilst having at the same time a weak injection from the anode side. As a consequence, the reverse recovery charge of the diode becomes minimum; it is known that this is the most effective way of reducing the peak reverse recovery current. The cathode-side stop layer ensures that the diode reverse recovery current decays softly.

When the emitter transparency is almost maximum, the on-state resistance becomes too high for practical applications. However, this disadvantage can be eliminated in a simple manner by interspersing p+-type emitter islands throughout the transparent emitter. This special embodiment corresponds to a further preferred embodiment and can be used both in diodes and in switches.

Further illustrative embodiments can be found in the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3a shows a structure of a diode as claimed in the invention in accordance with a first illustrative embodiment;

FIG. 3b shows a structure of a diode as claimed in the invention in accordance with a second illustrative embodiment.

Figure 1A:
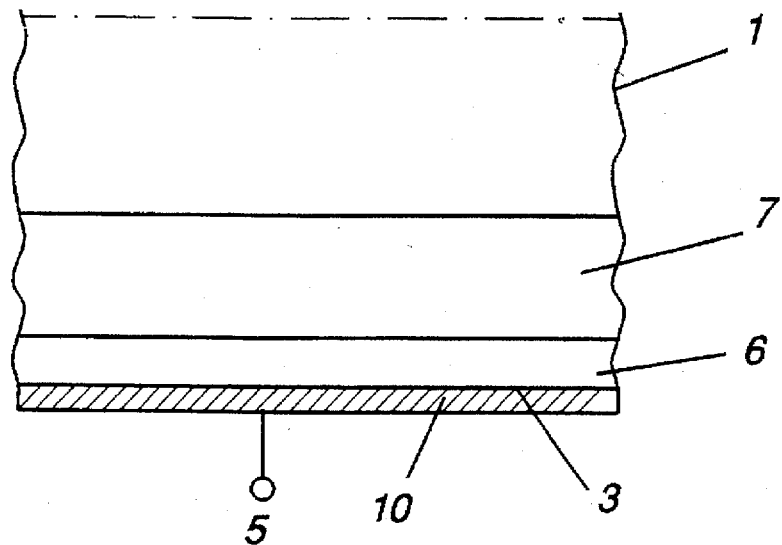
FIG. 1a shows an anode structure according to the invention for a semiconductor switch with stop layer and transparent emitter.

The reference numerals used in the drawings and their meaning are listed summarized in the list of designations.

DESCRIPTION OF THE PREFERRED EMBODIMENTS

Referring now to the drawings, wherein like reference numerals designate identical or corresponding parts throughout the several views, a power semiconductor component according to the invention comprises a semiconductor substrate (1) into which a number of layers of different doping are diffused. These layers are limited by two main areas (2 and 3). The first main area (2) is allocated to a cathode (4), the second one (3) to an anode (5). Anode (5) and cathode (4) are formed by corresponding metallizations (10 and 22, respectively).

Figure 1B:
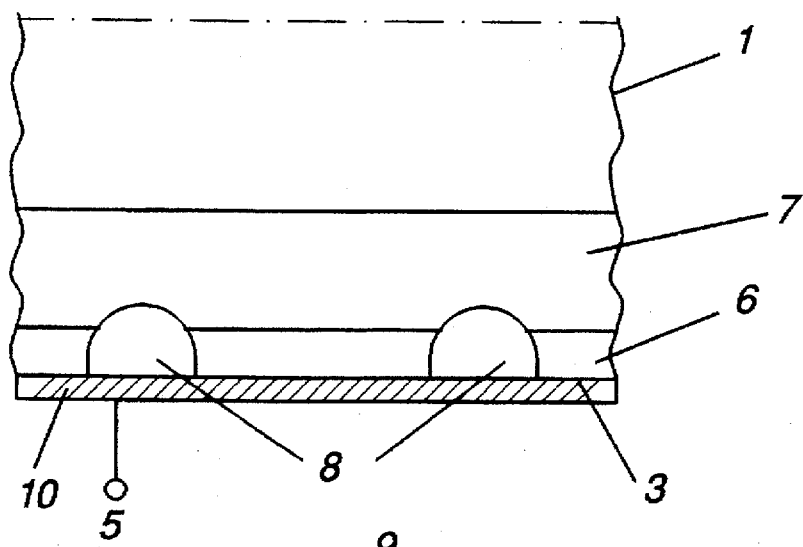
FIG. 1b shows an an anode structure according to the invention for a semiconductor switch with stop layer, transparent emitter and p+-type emitter islands.
Figure 1C:
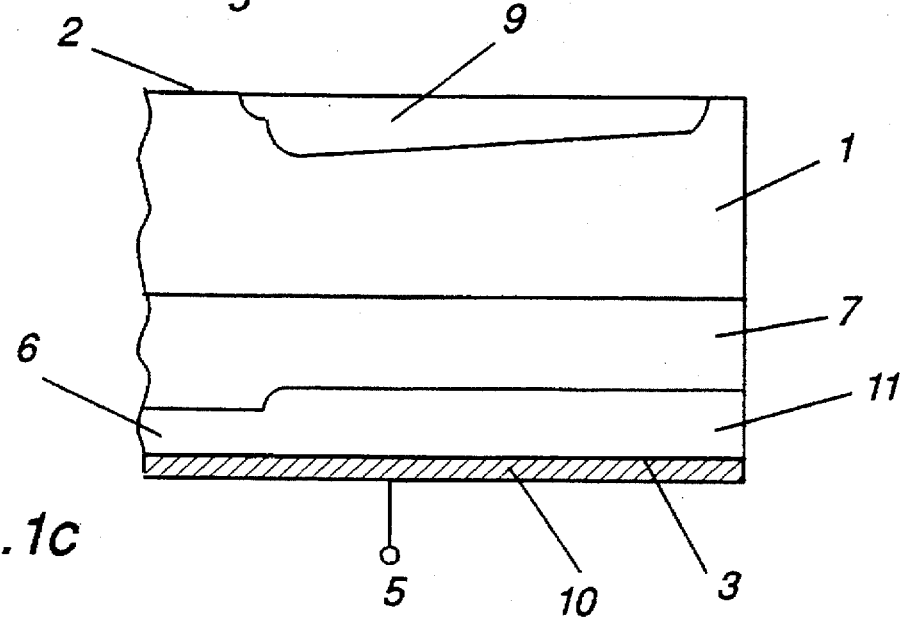
FIG. 1c shows an anode structure according to the invention for a semiconductor switch with stop layer, transparent emitter and a p+-type emitter region which is arranged underneath the edge termination.
Figure 2A:
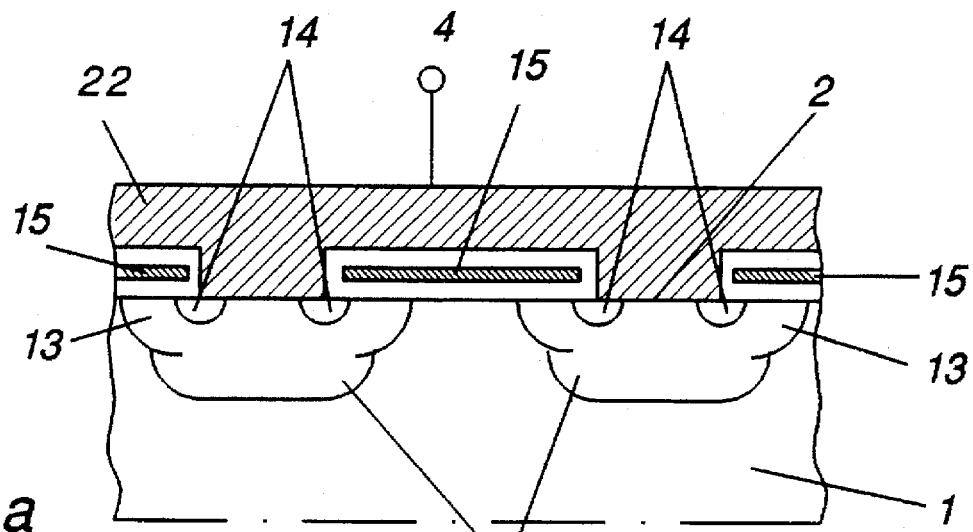
FIG. 2a shows a cathode structure of an IGBT.
Figure 2B:
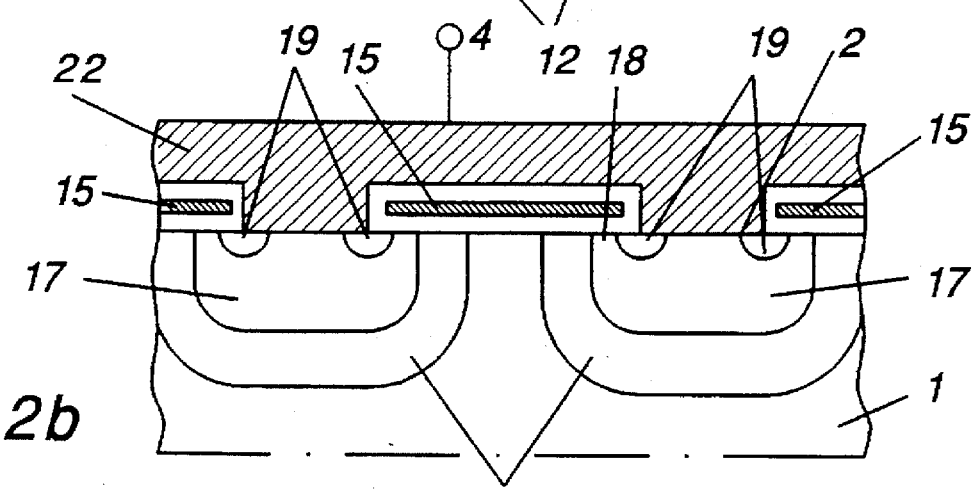
FIG. 2b shows a cathode structure of an MCT.
Figure 2C:
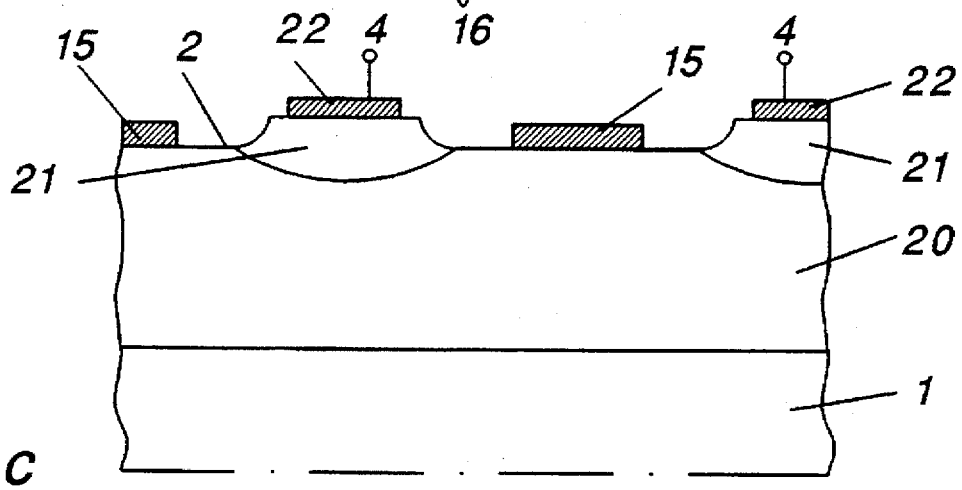
FIG. 2c shows a cathode structure of a GTO.

The cathode-side structures for semiconductor switches such as IGBTs, MCTs and GTOs are shown in FIGS. 2a–c and the anode-side structures are shown in FIGS. 1a–c. The cathode-side structures can be combined with the anode-side structures of FIGS. 1a, b by being joined to one another along the dot-dashed line. A semiconductor component according to the invention is also obtained if a combination of FIGS. 2a–c and 1a is joined to the left-hand edge of FIG. 1c.

FIG. 1a shows an anode structure according to the invention. It consists of an anode metallization (10), a transparent emitter (6) and a stop layer (7). The stop layer is followed by the semiconductor substrate (1) which is n-doped. In the case of an IGBT, MCT or a GTO, the semiconductor substrate (1) at the same time represents the n-type base. The transparent emitter (6) is preferably p+-doped and exhibits, for example, a depth of approximately 1.2 μm and a doping of $10^{18}$ cm$^{-3}$. The stop layer (7) following it is n-doped, preferably to a higher degree of doping than the semiconductor substrate (1). The following information can be used as guide values: depth more than approximately 30 μm, doping more than approximately $3*10^{16}$ cm$^{31\ 3}$. However, much deeper stop layers can also be created by using an epitaxial process.

Combining transparent emitter and stop layer has the following effect:

When, for example, a clamped, inductive load without passive protective circuit is turned off against a battery voltage of 2 kV, the field penetrates into the stop layer and pushes the charge through the transparent emitter out of the component. In consequence, the current drops to zero within a very short time, without the slowly decaying tail currents usually occurring. Tail currents would only occur if the space charge zone were not to reach into the stop layer (for example with a smaller battery voltage). Due to the lack of the tail currents, the switching losses are considerably reduced.

In the stop layer, the penetration of the space charge zone stagnates when the anode voltage is being built up. This creates an almost field-free space in which a residue of the stored charge remains. There is thus only a very small field for transporting this charge to the transparent emitter. The charge therefore largely disappears due to recombination. As a result, the current decays softly. The thicker the stop layer is made, the softer the current therefore decays. The ratio between charge extraction and recombination can be influenced by the degree of emitter transparency. The proportion of tail currents and at the same time also the switching losses are increased by reducing the transparency, for example by increasing the p+-type edge concentration.

The effect described above occurs in the simplest form of the anode structure according to the invention, which is shown in FIG 1a. The cathode structures of IGBTs, MCTs or GTOs can be placed against the dot-dashed line. These cathode structures are shown in FIGS. 2a–c.

FIG. 2a shows a cathode structure of an IGBT. It comprises an n-doped semiconductor substrate (1), also called n-type base, and IGBT structures diffused into it. The IGBT structures, in turn, comprise a p+-type collector (12), a p-type tub (13) and an n+-type source (14). Above the cathode-side main area, a gate electrode (15) is arranged in an insulated manner. The current flow between cathode (4) and anode (5) can be turned on and off in a familiar manner by applying a voltage to the gate electrode (15).

FIG. 2b shows a cathode structure of an MCT. The basis is again an n-doped semiconductor substrate (1). A p-type base (16), an n-type emitter (17), a channel region (18) and a p-type shorting region (19) follow one another in the direction of the cathode. An insulated gate electrode (15) is again arranged above the cathode-side main area (2) and reaching from one MCT region to the adjacent one. The current flow from the anode (5) to the cathode (4) can be turned on and off in a familiar manner by applying a voltage to this gate electrode.

FIG. 2c, finally, shows a cathode structure of a GTO. There is again an n-doped semiconductor substrate (1). A p-type base (20) which penetrates to the cathode-side surface (2) at various locations and is connected to a gate electrode (15) at these locations follows the semiconductor substrate (1) in the direction of the cathode (4). A plurality of n-doped cathode regions (21) is diffused into the cathode-side surface (2). If a control current is applied to the gate (15), the current between anode (5) and cathode (4) can be turned on and off in a familiar manner.

The cathode structures according to FIGS. 2a–c can then be combined with the anode structure according to FIG. 1a in such a manner that IGBTs, MCTs or GTOs according to the invention are produced.

To be able to turn off the current more steeply, it is desired to make the p+-type emitter (6) more and more transparent, that is to say to give it less and less doping. As a result, however, the on-state resistance becomes too high for practical applications. This circumstance can be remedied now by interspersing p+-type emitter islands (8) throughout the transparent emitter. Such an anode structure is shown in FIG. 1b. It can be used for IGBT, MCT and GTO. The depth of these emitter islands is, for example, 5 μm and their edge concentration is $10^{19}$ cm$^{-3}$. Due to such emitter islands, the on-state resistance drops again. A further advantage lies in the fact that the voltage rate dV/dt is effectively limited. The proportion of the area of the islands in the total area of the anode can be selected to be very low in this arrangement.

FIG. 1c shows a further preferred anode structure of a semiconductor component according to the invention. Instead of individual p+-type emitter islands (8), there is a coherent p+-type region (11) which is arranged in line underneath the edge termination (9) of the cathode-side main area (2). The section of the semiconductor component shown in FIG. 1c thus represents the edge of the component. On the left-hand edge of the figure, an anode structure according to FIG. 1a and a cathode structure according to FIGS. 2a–c, for example, can then be joined on. This provides a semiconductor component, particularly an IGBT, MCT or GTO, having a non-transparent p+-type emitter region (11) underneath the edge termination (9). The known structures can be used as edge termination (9). A planar edge termination (9) as shown in FIG. 1c is particularly preferred.

The effect of the anode structure just described is similar to that with emitter islands (8). In addition to the dV/dt limiting, the arrangement according to FIG. 1c, however, exhibits an improved charge carrier extraction. This is because the transparent emitter (6) A coincides with an active charge emitting area of the cathode of the component. This results in lower turn-off losses.

The effect of the p+-type region (11) underneath the edge termination is similar to limiting the dV/dt by means of a separate snubber capacitor. Accordingly, a further advantage of this structure shown in FIG. 1c consists in that the snubber capacitors can be at least reduced in size and possibly even completely omitted.

In the text which follows, the special situation in the case of the diode is also discussed. The losses of diodes, too, must be optimized. This is why punch-through structures with minimum thickness must also be the aim in this case. However, such diodes exhibit an abrupt current chopping at the end of the reverse recovery phase. This can lead to intolerable voltage peaks even with very small inductances. This is why it has previously been preferred to use unoptimized diodes with oversized thickness.

Due to the reversal of the current, the stop layer according to the invention must be inserted on the cathode side in diodes. FIG. 3a shows the corresponding situation. The anode (5), which is formed by an anode metallization (10), is followed by the transparent p+-type emitter (6), the n-doped semi-conductor substrate (1), the n-doped stop layer (7) and a number of n+-type cathode regions (21).

The effect of the transparent emitter (6) and of the stop layer (7) essentially corresponds to that of the switches described above. The use of p+-type emitter islands (8) is also of advantage. An illustrative embodiment having such a structure is shown in FIG. 3b.

Overall, the invention thus provides a power semiconductor component for high blocking voltages which can be constructed to be thinner without problems and is optimized with respect to losses.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power semiconductor component, in particular for high blocking voltages comprising:
   a semiconductor substrate into which a number of layers of first and second conductivity types are diffused between a first main area and a second main area;
   a cathode electrode formed on the first main area, and an anode electrode formed by a metallization covering the second main area;
   a transparent emitter of said first conductivity type diffused in the substrate adjacent the anode electrode, an impurity concentration and a thickness of said transparent emitter being chosen such that at least 50% of a total current flowing through the transparent emitter is covered by minority carriers; and
   a stop layer of said second conductivity type formed between the transparent emitter and the cathode electrode for reducing the thickness of the semiconductor substrate and for minimizing switching losses.

2. The power semiconductor component as claimed in claim 1, wherein:
   the semiconductor substrate is n-doped;
   a p+-type emitter layer which is constructed as the transparent emitter and the stop layer are diffused in between the second main area and the semiconductor substrate, the stop layer being n-doped and having higher doping than the semiconductor substrate;
   a plurality of Insulated Gate Bipolar Transistor regions each having a p+-type collector, a p-type tub, and an n+-type source diffused into the substrate from the first main area; and
   a gate electrode is provided insulated above the first main area and between two of said plurality of Insulated Gate Bipolar Transistor regions.

3. The power semiconductor component as claimed in claim 2, wherein the transparent p-type emitter is interspersed with a multiplicity of p+-type emitter islands which have higher doping than the transparent emitter.

4. The power semiconductor component as claimed in claim 2, wherein
   the semiconductor component exhibits an edge termination, and
   the transparent emitter changes into a non-transparent p+-type region underneath the edge termination.

5. The power semiconductor component as claimed in claim 4, wherein said p+-type region has a higher doping than the transparent emitter and extends further into the stop layer than the transparent emitter.

6. The power semiconductor component as claimed in claim 2, further comprising: an edge termination region constructed as a planar edge termination.

7. The power semiconductor component as claimed in claim 1, wherein:
   the semiconductor substrate is n-doped;
   a p+-type emitter layer which is constructed as the transparent emitter and the stop layer are diffused in between the second main area and the semiconductor substrate, the stop layer being n-doped and having higher doping than the semiconductor substrate;
   a plurality of MOS controlled Thyristor regions each having a p-type base, an n-type emitter, a channel region and a p-type shorting region are diffused into the substrate through the first main area; and
   a gate electrode is provided insulated above the first main area and between two of said MOS controlled Thyristor regions.

8. The power semiconductor component as claimed in claim 7, wherein the transparent p-type emitter is interspersed with a multiplicity of p+-type emitter islands which have higher doping than the transparent emitter.

9. The power semiconductor component as claimed in claim 7, wherein
   the semiconductor component exhibits an edge termination, and
   the transparent emitter changes into a non-transparent p+-type region underneath the edge termination.

10. The power semiconductor component as claimed in claim 9, wherein said p+-type region has a higher doping than the transparent emitter and extends further into the stop layer than the transparent emitter.

11. The power semiconductor component as claimed in claim 7, further comprising: an edge termination region constructed as a planer edge termination.

12. The power semiconductor component as claimed in claim 1, wherein:
   the semiconductor substrate is n-doped;
   a p+-type emitter layer which is constructed as the transparent emitter and the stop layer are diffused between the second main area and the semiconductor substrate, the stop layer being n-doped and having higher doping than the semiconductor substrate;
   a p-type base and a plurality of n-type cathode regions are diffused in the substrate through the first main area; and
   the cathode regions being covered by a cathode metallization forming the cathode electrode.

13. The power semiconductor component as claimed in claim 12, wherein the transparent p-type emitter is interspersed with a multiplicity of p+-type emitter islands which have higher doping than the transparent emitter.

14. The power semiconductor component as claimed in claim 12, wherein
   the semiconductor component exhibits an edge termination, and
   the transparent emitter changes into a non-transparent p+-type region underneath the edge termination.

15. The power semiconductor component as claimed in claim 14, wherein said p+-type region has a higher doping than the transparent emitter and extends further into the stop layer than the transparent emitter.

16. The power semiconductor component as claimed in claim 12, further comprising: an edge termination region constructed as a planar edge termination.

17. The power semiconductor component as claimed in claim 1, wherein:
   the semiconductor substrate is n-doped;
   a p+-type emitter layer which is constructed as the transparent emitter is diffused in between the second main area and the semiconductor substrate; and
   the stop layer and a plurality of n+-type cathode region are diffused in from the first main area, the stop layer being n-doped, having a higher doping than the semiconductor substrate, and being inserted between the first main area and the semiconductor substrate.

18. The power semiconductor component as claimed in claim 17, wherein the transparent p-type emitter is interspersed with a multiplicity of p+-type emitter islands which have higher doping than the transparent emitter.

19. The power semiconductor component as claimed in claim 17, wherein the semiconductor component exhibits an edge termination, and the transparent emitter changes into a non-transparent p+-type region underneath the edge termination.

20. The power semiconductor component as claimed in claim 19, wherein said p+-type region has a higher doping than the transparent emitter and extends further into the stop layer than the transparent emitter.

21. The power semiconductor component as claimed in claim 17, further comprising: an edge termination region constructed as a planar edge termination.

22. The power semiconductor component as claimed in claim 1, wherein the transparent emitter exhibits a depth of approximately 1.2 μm and a impurity concentration of approximately $10^{18}$ cm$^{-3}$.

23. The power semiconductor component as claimed in claim 1, wherein the stop layer exhibits a depth of more than approximately 30 μm and an impurity concentration of more than approximately $3\times10^{16}$ cm$^{-3}$.

* * * * *